United States Patent [19]

Park

[11] Patent Number: 5,561,690

[45] Date of Patent: Oct. 1, 1996

[54] HIGH SPEED VARIABLE LENGTH CODE DECODING APPARATUS

[75] Inventor: Yong-Gyu Park, Seoul, Rep. of Korea

[73] Assignee: Daewoo Electronics Co., Ltd., Seoul, Rep. of Korea

[21] Appl. No.: 346,067

[22] Filed: Nov. 29, 1994

[30] Foreign Application Priority Data

Nov. 29, 1993 [KR] Rep. of Korea .............. 93-25675

[51] Int. Cl.$^6$ .............. H03D 1/00; H03M 7/40
[52] U.S. Cl. .............. 375/340; 341/67; 341/65
[58] Field of Search .............. 375/340, 241, 375/242, 244, 246, 253; 341/67, 63–65; 358/261.1, 261.4

[56] References Cited

U.S. PATENT DOCUMENTS

| | | | |
|---|---|---|---|
| 5,173,695 | 12/1992 | Sun et al. | 341/67 |
| 5,245,338 | 9/1993 | Sun | 341/67 |
| 5,343,195 | 8/1994 | Cooper | 341/67 |
| 5,400,075 | 3/1995 | Sawatier | 375/241 |
| 5,404,166 | 4/1995 | Gillard et al. | 375/242 |

*Primary Examiner*—Stephen Chin
*Assistant Examiner*—Huong Luu
*Attorney, Agent, or Firm*—Anderson Kill Olick & Oshinsky, P.C.

[57] ABSTRACT

A variable length code (VLC) decoding apparatus for decoding sequential variable length codewords includes a second barrel shifter cascaded to a first barrel shifter for providing a second table memory device with a decoding window output sequence which is directly shifted in response to a codeword length output from a first table memory device so that the first bit in the decoding window output sequence is the first bit of the next variable length codeword in a decoding window output sequence from the first barrel shifter; and the second table memory device for producing a fixed length codeword in response to each variable length codeword in the second decoding window output sequence, to thereby decode, at each clock cycle, consecutively two variable length codewords without an operational delay in an accumulator for shifting the decoding window of the first barrel shifter.

1 Claim, 3 Drawing Sheets

FIG. 3

| | SECOND BARREL SHIFTER 40 OUTPUT | FIRST BARREL SHIFTER 30 OUTPUT | LATCH 20 | LATCH 10 | LEAD 11 | READ | BS 40 SHIFT | BS 30 SHIFT | DECODED WORD | LENGTH 2 | LENGTH 1 |
|---|---|---|---|---|---|---|---|---|---|---|---|
|   | X | X | X | X | $a_1\text{-}a_8\ b_1\text{-}b_8\ c_1c_2$ | 1 | X | X | X | X | X |
| 1 | X | X | X | $a_1\text{-}a_8\ b_1\text{-}b_8\ c_1c_2$ | $c_3\text{-}c_5\ d_1\text{-}d_5\ e_1\text{-}e_8$ | 1 | X | X | X | X | X |
| 2 | $a_1\text{-}a_8\ b_1\text{-}b_8\ c_1c_2$ | $a_1\text{-}a_8\ b_1\text{-}b_8\ c_1c_2$ | $a_1\text{-}a_8\ b_1\text{-}b_8\ c_1c_2$ | $c_3\text{-}c_5\ d_1\text{-}d_5\ e_1\text{-}e_8$ | $f_1\text{-}f_7\ g_1\text{-}g_8$ | 1 | X | X | A | X | 8 |
|   | $b_1\text{-}b_8\ c_1c_2\ 00\ 000000$ | $a_1\text{-}a_8\ b_1\text{-}b_8\ c_1c_2$ | $a_1\text{-}a_8\ b_1\text{-}b_8\ c_1c_2$ | $c_3\text{-}c_5\ d_1\text{-}d_5\ e_1\text{-}e_8$ | $f_1\text{-}f_7\ g_1\text{-}g_8$ | 0 | 8 | X | B | 6 | X |
| 3 | $c_1\text{-}c_5\ d_1\text{-}d_5\ e_1\text{-}e_8$ | $c_1\text{-}c_5\ d_1\text{-}d_5\ e_1\text{-}e_8$ | $a_1\text{-}a_8\ b_1\text{-}b_8\ c_1c_2$ | $c_3\text{-}c_5\ d_1\text{-}d_5\ e_1\text{-}e_8$ | $f_1\text{-}f_7\ g_1\text{-}g_8$ | 0 | X | 14 | C | X | 5 |
|   | $d_1\text{-}d_5\ e_1\text{-}e_8\ 00000$ | $c_1\text{-}c_5\ d_1\text{-}d_5\ e_1\text{-}e_8$ | $c_3\text{-}c_5\ d_1\text{-}d_5\ e_1\text{-}e_8$ | $c_3\text{-}c_5\ d_1\text{-}d_5\ e_1\text{-}e_8$ | $f_1\text{-}f_7\ g_1\text{-}g_8$ | 0 | 5 | X | D | 5 | X |
| 4 | $e_1\text{-}e_8\ f_1\text{-}f_7\ g_1$ | $e_1\text{-}e_8\ f_1\text{-}f_7\ g_1$ | $c_3\text{-}c_5\ d_1\text{-}d_5\ e_1\text{-}e_8$ | $f_1\text{-}f_7\ g_1\text{-}g_8$ | $h_1\text{-}h_8\ \ldots$ | 1 | X | 24 | E | X | 8 |
|   | $f_1\text{-}f_7\ g_1\ 00000000$ | $e_1\text{-}e_8\ f_1\text{-}f_7\ g_1$ | $c_3\text{-}c_5\ d_1\text{-}d_5\ e_1\text{-}e_8$ | $f_1\text{-}f_7\ g_1\text{-}g_8$ | $h_1\text{-}h_8\ \ldots$ | 0 | 8 | X | F | 7 | X |

HIGH SPEED VARIABLE LENGTH CODE DECODING APPARATUS

FIELD OF THE INVENTION

The present invention relates to a variable length code(VLC) decoding apparatus; and, more particularly, to an improved VLC decoding apparatus which is capable of providing a high speed decoding operation by effectively reducing the operational delay of an accumulator contained therein.

DESCRIPTION OF THE PRIOR ART

Variable length coding is a technique often used for lossless data compression. This technique is used to convert fixed-length data to variable-length codewords based on the statistical occurrences of the data. The length of the codewords is chosen in such a manner that shorter codewords are used to represent more frequently occurring data and longer codewords are selected to represent less frequently occurring data. By properly assigning the variable-length codewords to a library of all possible source codewords, the average word length of the variable-length codewords becomes shorter than that of the original data, thereby rendering it possible to achieve data compression.

In this connection, Huffman code design is a procedure commonly used to construct a minimum redundant variable length code for a known data statistic. In general, the encoding process can be implemented by using a table-lookup process using input data to address the table. The codewords and the word-length information are stored as contents of the table and outputted sequentially through the use of a buffer at a constant data rate onto the data channel.

At the receiving end, however, the decoding process is more complicated. Owing to the variable length nature, each codeword has to be segmented from the received bit string before it can be decoded into a source symbol. Therefore, the design of a variable word length decoder is more difficult than that of a variable length encoder.

There are several known apparatus for use to decode a stream of variable length codewords. Among them, most often used is a VLC decoder employing a tree-searching algorithm such as the one disclosed in U.S. Pat. No. 4,899,149 issued on Feb. 6, 1990 to Gary Kahan. In this device, a variable length code is represented by a tree with codewords as leaves(also called terminal nodes). The decoding process starts from the root of the code tree and is guided by the received bit stream to follow one of two branches at each node. When a leaf is reached, the end of a codeword is detected and is segmented from the remaining bit stream. This type of decoding apparatus includes a logic circuitry corresponding to the tree and a control circuitry to traverse the code tree. This approach may be slow, however, especially for long codewords, since a bit-by-bit search through the code tree is required for each decoded symbol.

A lookup-table based VLC decoder is disclosed in U.S. Pat. No. 5,173,695 issued on Dec. 22, 1992 to Ming-Ting Sun, et al.; and U.S. Pat. No. 5,245,338 to Ming-Ting Sun. That decoder includes two cascaded latch circuits, each having a bit capability equal to the maximum codeword length, which store consecutive bits supplied from an input buffer memory for storing the stream to be decoded in fixed-length data segments; a barrel shifter connected to the two latch circuits for providing a sliding decoding window output equal in length to the maximum codeword length; an accumulator which accumulates, modulo the maximum codeword length, the lengths of sequentially decoded variable length codewords; and a lookup-table memory device for outputting a fixed-length word corresponding to a variable-length codeword contained in the sliding decoding window output and for outputting a length of the variable-length codeword. As a codeword is decoded during each clock cycle, its length is accumulated and the decoding window of the barrel shifter is shifted to begin with the first bit of the next to-be-decoded codeword. When, during a clock cycle, the accumulated length exceeds the maximum codeword length, which would indicate that all the bits in the second latch circuit have been decoded, the bits in the first latch circuit are transferred into the second latch circuit and the next fixed-data segment of bits is read into the first latch circuit from the input buffer memory.

In the afore-described decoder structure, the speed of operation is limited by the operational delay of the components in a critical path that includes the lookup-table memory, the barrel shifter, and the accumulator. It is the accumulator, which as are part of its functions, controls the reading operation of the input buffer memory into the second latch, that causes a substantial or significant portion of the total operational delay. This delay will have the deleterious effect for high-speed decoding required in, e.g., high definition television systems.

SUMMARY OF THE INVENTION

It is, therefore, a primary object of the invention to provide a VLC decoding apparatus which employs two barrel shifters and two corresponding variable length decoding table memories to alternately reducing the operational delay in an accumulator, thereby advantageously achieving a high speed decoding operation.

In accordance with the present invention, a variable length code decoding apparatus for decoding, at a fixed clock rate, sequential variable length codewords supplied from an input buffer which stores an input bit stream to be decoded in fixed length segments having the length equal to the longest length of the variable length codewords, comprises: first and second bit storage means, in response to a read signal, for storing consecutively two fixed length segments from the input buffer; first decoder shift means connected to the first and the second bit storage means and having a first decoding window for producing a first decoding window output sequence of the two fixed length segments, the bit length of the first decoding window output being equal to the longest length of the variable length codewords and said first decoding window being shifted in direct response to a window control signal; first memory means coupled to the first decoder shift means for producing a fixed length codeword in response to a variable length codeword that begins at the first bit position of the first decoding window output sequence and for producing a first codeword length output corresponding to the decoded variable length codeword; second decoder shift means connected to said first decoder shifter means and having a second decoding window for producing a second decoding window output sequence from bits contained in the first decoding window output sequence and a predetermined fixed length segment, the bit length of the second decoding window output being equal to the longest length of the variable length codewords and said decoding window being shifted in direct response to the first codeword length output so that the first bit position in the second decoding window output sequence is the first bit position of a next variable length codeword to be decoded in the first decoding window output sequence; second memory means for producing a fixed length codeword in response to said next variable length codeword and for producing a second codeword length output corresponding to the decoded next variable length codeword; and accumulator means for adding the first and the second codeword length outputs to produce an added codeword length output and for adding, at each clock, the added codeword length output to a previously accumulated codeword length output in order to produce the window control signal indicating the added and accumulated codeword length, said accumulator generating the read signal to retrieve a next fixed length segment stored in the input buffer when said added and accumulated codeword length is greater than the longest length of the variable length codewords, said next fixed length segment being stored in the first bit storage means and the fixed length segment previously stored in the first bit storage means being transferred to the second bit storage means.

BRIEF DESCRIPTION OF THE DRAWINGS

The above and other objects and features of the instant invention will become apparent from the following description of preferred embodiments taken in conjunction with the accompanying drawings, in which:

FIG. 3 provides an explanatory diagram for illustrating the operation of the VLC decoding apparatus shown in FIG. 1.

DETAILED DESCRIPTION OF THE PREFERRED EMBODIMENTS

Figure 1:
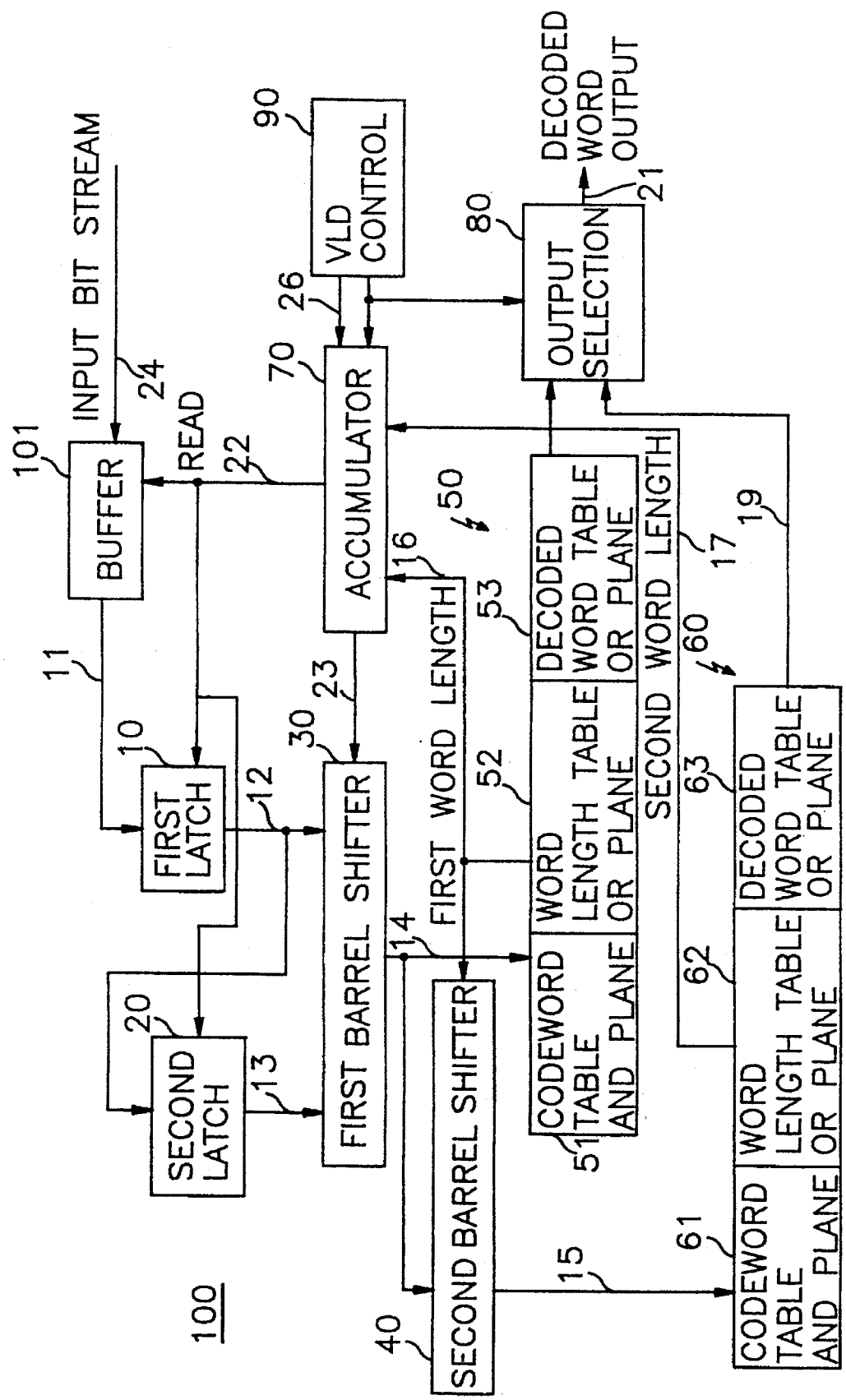
FIG. 1 shows a schematic diagram of a VLC decoding apparatus in accordance with the present invention.

A VLC decoder in accordance with a preferred embodiment of the present invention is shown in FIG. 1. It is assumed that the maximum length of the variable-length codeword to be decoded is 16 bits. The VLC decoder 100 decodes successive variable length codewords inputted to it in a continuous bit stream and outputs decoded fixed length codewords corresponding thereto, at a fixed symbol clock, on a lead 24; and comprises first and second latch circuits 10 and 20, first and second barrel shifters 30 and 40, and first and second memory devices 50 and 60.

A serial data stream received on a data channel 24, is inputted to an input buffer memory 101 which stores, in fixed-length data segments, the serial data stream variable-length words and sequentially outputs fixed length data segments, e.g., 16-bit segments on a lead 11 in response to a READ signal on a lead 22, wherein the bit length of the data segment is identical to the maximum bit length of the variable length codeword.

The first latch circuit 10 is connected to the input buffer memory 101 and serves to sequentially receive the fixed-length data segments in response to the READ signal on the lead 22. The second latch circuit 20 is connected to the first latch circuit 10 and functions to receive the fixed-length data segment previously held in the first latch circuit 10. When a new data segment needs to be supplied, a READ control signal is activated on the lead 22. In response thereto, the buffer memory 101 supplies the next data segment onto the lead 11; the first latch circuit 10 receives the next data segment; and the data segment previously held in the first circuit 10 is transferred to the second latch circuit 20. The second latch circuit 20 thus always contains the data segment which is sequentially earlier in time than the data segment contained in the first latch circuit 10. The two data segments contained in the first and the second latch circuits 10 and 20 comprise a 32-bit sequence of the serial input data to be decoded, which is twice the size of the maximum length codeword.

The two data segments in the first and the second latch circuits 10 and 20 are inputted to the first barrel shifter 30 over parallel leads 12 and 13, respectively. That is, the bits in this new segment are concatenated with the bits in the previous segment and then transferred into the first barrel shifter 30. The output from the first barrel shifter 30 on a lead 14 is a 16-bit sequence of the two input data segments: the previous data segment outputted from the second latch circuit 20 and the current data segment outputted from the first latch circuit 10. As will be described below, when the first window control signal is activated on the lead 23, the barrel shifter is directly shifted to place the next sequence of the two delta segments. When a shift greater than fifteen occurs, indicating that all bits in the previous data segment have been decoded, the current data segment in the first latch circuit 10 is inputted to the second latch circuit 20 as a previous data segments and the next 16-bit segment is read into the first latch circuit 10 from the input buffer memory 101 as a current data segment. The outputs of the first barrel shifter 30 are connected to the first memory device 50 and the second barrel shifter 40. In the described embodiment, the first memory device 50 is implemented by a programmable logic array(PLA). The PLA 50 shown in FIG. 1 is shown to comprise a codeword table AND plane 51, a word length table OR plane 52 and a decoded word table OR plane 53. As is also described in U.S. Pat. Nos. 5,267,266 and 5,173,695, each codeword is represented as an entry in the codeword table AND plane 51 according to the bit pattern of the codeword. Since most codeword in a codeword library, which has the maximum word length of 16 bits, have fewer than 16 bits, the bit positions of the output from the barrel shifter, beyond the actual codeword bit pattern in the codeword table, are designated "don't care" positions. A codeword is detected when a sequence from the barrel shifter 30 matches one of the codeword bits patterns stored in the codeword table AND plane 51. Thus, for example, if one of the variable-length codeword bit patterns is "01", and the 16-bit sequence from the barrel shifter 30 has a pattern "0111110000011101", then a match occurs on the first two bits. The first two bits are thus recognized as a variable-length codeword and the next word begins with the third bit.

When the first decoding window output sequence on the lead 14 matches an entry in the codeword table AND plane 51, the entry in the word length table OR plane 52 and the entry in the decoded word table OR plane 53 are activated. The decoded word table OR plane 53 outputs onto a lead 21 through an output selection block 80 the decoded fixed length word corresponding to the matched variable length codeword in the codeword table AND plane 51.

The word length table OR plane 52 produces a first word length signal on a lead 16 that indicates the length of the matched variable length codeword in the codeword table 51. For the example above, the word length table 51 outputs "2", representing the length of the detected word "01". This word length, on a lead 16, is directly coupled to the barrel shifter 40 as a second window control signal. The word length is also inputted, on a lead 16, into an accumulator circuit 70 which accumulates the decoded word lengths and generates the first window control signal on the lead 23 used to control the first barrel shifter 30.

As is described above, the output from the first barrel shifter 30, i.e., the first decoding window output sequence, is inputted to the second barrel shifter 40 over a lead 14. The second barrel shifter 40 is substantially identical to the first barrel shifter 30 except that the current data segment is fixed as "0000000000000000" and the first decoding window output sequence is always supplied as a previous data segment. The second decoding window output sequence from the second barrel shifter 40 on a lead 15 is a 16-bit sequence shifted by the second window control signal which indicates the length of a previously matched variable length codeword in the first memory device 50. As is described, when the second window control signal is activated on the lead 16, the second decoding window of the barrel shifter 40 is directly shifted to place the specific sequence beginning with the first bit of the next to-be-decoded variable length codeword in the first decoding window output sequence.

The second decoding window output sequence is coupled to the second memory device 60. In accordance with a preferred embodiment, the second memory device 60 is substantially identical to the first memory device 50, but may include only a part of the codeword table which represents variable length coded transform coefficients. The second memory device is also implemented by a programmable logic array (PLA) and comprises a codeword table AND plane 61, a word length table OR plane 62 and a decoded word table OR plane 63. As is described above, when the second decoding window output sequence on the lead 15 matches an entry in the codeword table AND plane 61, the entry in the word length table OR plane 62 and the entry in the decoded word table OR plane 63 are activated. The decoded word table OR plane 63 outputs, on a lead 19, to an output selection block 80 the fixed length codeword corresponding to the matched variable length codeword in the codeword table AND plane 61. The fixed length codeword is outputted onto a lead 21 from the output selection block 80 in response to an output change signal outputted from a variable length decoding(VLD) control circuit 90. The word length table OR plane 62 produces an second word length signal on a lead 17 that indicates the length of the matched variable length codeword in the codeword table AND plane 60. This word length, on a lead 17, is inputted to the accumulator circuit 70.

The accumulator 70 serves to add the first codeword length to the second codeword length to produce an added codeword length in response to an output change signal outputted from the VLD control circuit 90; and to sum the added codeword length with the previous accumulated modulo 16 word lengths to produce the first window control signal on a lead 23 in response to a clock signal outputted from the VLD control circuit 90. The first window control signal indicating the new accumulated codeword length is used to control the first barrel shifter 30. That is, in response to the clock signal, this first window control signal in the accumulator 70 is outputted on the lead 23 to the first barrel shifter 30 which shifts the position of the first decoding window to the next undecoded bits contained in the previous data segment of the first barrel shifter 30.

When the new accumulated sum exceeds 15, the accumulator 70 activates a READ signal that indicates that all the bits in the previous data segment of the second latch circuit 20 have been decoded and can now be discarded. This READ signal of "1" is outputted on a lead 22 to the input buffer memory 101 and the first and the second latch circuits 10 and 20 in order to bring the next 16-bit segment in the input buffer memory 101 into the first latch circuit 10 while transferring the contents of the first latch circuit 10 to the second latch circuit 20.

It can be seen, therefore, that the first window control signal outputted from the accumulator 70 is activated after two variable length codewords contained in the previous data segment have been decoded; and the READ signal is activated only after all the bits in the previous data segment have been decoded which, depending the length of the decoded words, can be several clock cycles duration.

Figure 2:
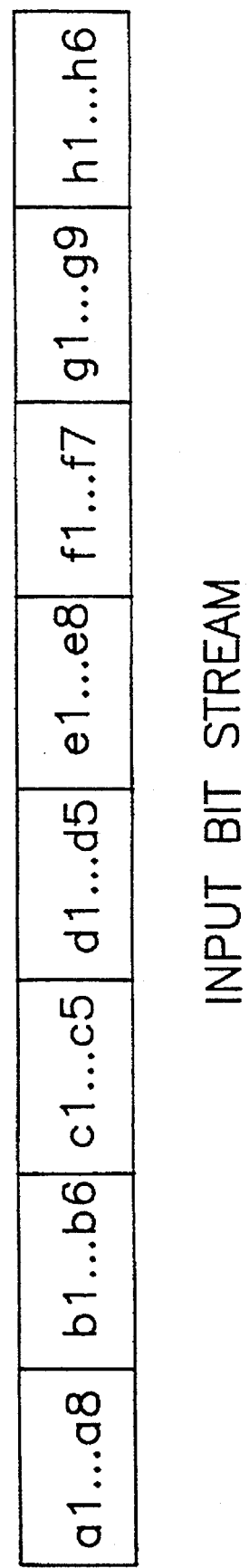
FIG. 2 depicts the input bit stream used for explaining the operation for the VLC decoding apparatus shown in FIG. 1.

The operation of the decoder in FIG. 1 may be more readily understood with reference to an example shown in tabular form in FIGS. 2 and 3. It is assumed that the data stream inputted from the data channel 24 to the input buffer memory 101 shown in FIG. 1 consists of the bit stream a1–a8b1–b6c1–c5d1–d5e1–e8f1–f7g1–g9h1–h6 . . . , as shown in FIG. 2, wherein a1–a8 represents the eight bits in the first variable length codeword, b1–b6 represents the six bits in the second variable length codeword, etc.

Referring to FIG. 3, prior to the first clock tick, the first and the second latch circuits 10 and 20 are initialized. With the READ signal being "1", the first data segment, consisting of the 16 bits of a1–a8b1–b6c1c2, is inputted on a lead 11 to the first latch circuit 10. At this time, the outputs of the first and the second latch circuits 10 and 20, the outputs of the first and the second barrel shifters 30 and 40, and the outputs of the first and the second memory devices 50 and 60 are noise values, represented in FIG. 3 with an "X".

At the first clock tick, a READ signal is "1" wherein a next data segment of c3–c5d1–d5e1–e8 is outputted from the input buffer memory 101 onto the lead 11. At this READ signal, the data segment of a1–a8b1–b6c1c2 is latched in the first latch circuit 10.

At the second clock tick, a READ signal is "1" and a next data segment of f1–f7g1–g9 is outputted from the input buffer memory 10. At this READ signal, the data segment of c3–c5d1–d5e1–e8 is latched as a current data segment into the first latch circuit 10 and the data segment of a1–a8b1–b6c1c2 previously latched in the first latch circuit 10 is transferred as a previous data segment into the second latch circuit 20. The current and previous data segments are simultaneously coupled into the first barrel shifter 30 which transfers the previous data segment as the first decoding window output sequence on a lead 14 since the first window control signal is "0". The first memory device 50 recognizes the first eight bits in the first decoding window output sequence as decoded word "A" and outputs this fixed length decoded word, A, through the output selection block 80 onto the lead 21. The first memory device 50 also outputs the length, "8", of this word on a lead 16. The second window control signal indicating the previous decoded length, "8", is then coupled to the second barrel shifter 40 which transfers the 16-bit sequence of b1–b6c1c200000000 as the second decoding window output sequence into the second memory device 60. The second memory device 60 recognizes the first six bits in the second decoding window output sequence as decoded word "B" and outputs this fixed length decoded word, B, to the output selection block 80 which, in response to the output change signal, outputs the fixed length decoded word, B, onto the lead 21. The output change signal is activated from the VLD control circuit 90 after a predetermined time period from the second clock tick, wherein the predetermined time period encompasses the operational delays of the first barrel shifter 30 and the first and the second memory devices 50 and 60. The second memory device 50 also outputs the length, "6", of that decoded word on a lead 17. The accumulator 70 adds, in response to output change signal on a lead 27, the previous decoded length, "8", on the lead 16 to the decoded length, "6", on the lead 17 in order to produce the first window control signal indicating a length, "14", wherein the previously accumulated modulo 16 word length is "0".

At the third clock tick, since the accumulated codeword length is less than "16", the READ signal is "0". The first window control signal is coupled to the first barrel shifter 30 wherein the first decoding window is shifted to encompass the 15th bit in the previous data segment through the 30th in the current data segment. Therefore, the 16-bit sequence of c1–c5d1–d5e1–e6 is coupled to the first memory device 50 and the second barrel shifter 40. The first memory device 50 recognizes the first five bits in the previous data segment as decoded word "C" and outputs this fixed length decoded word, C, through the output selection block 80 onto the lead 21. The first memory device 50 also outputs the length, "5", of this word on the lead 16. The second window control signal indicating the previous decoded length, "5", is then coupled to the second barrel shifter 40 which transfers the 16-bit sequence of d1–d5e1–e600000 into the second memory device 60. The second memory device 60 recognizes the first five bits in the previous data segment as decoded word "D" and outputs this fixed length decoded word, D, to the output selection block 80 which, in response to the output change signal, outputs the fixed length decoded word, D, onto the lead 21. The second memory device 60 also outputs the length, "5", of this decoded word on a lead 17. The accumulator 70 adds the previous decoded length, "5", on the lead 16 to the decoded length, "5", on the lead 17 in response to the output change signal on a lead 26. The accumulator 70 also sums the added length of "10" with the previously accumulated modulo 16 codeword length "14" in order to produce the first window control signal indicating a length, "24", on a lead 23 in response to the clock signal on the lead 26.

At the fourth clock tick, since the accumulated codeword length is greater than "16", the READ signal is "1". At this READ signal, a next data segment of h1–h6 . . . is retrieved from the input buffer memory device 101; the data segment of f1–f7g1–g9 is latched as a current data segment into the first latch circuit 10; and the data segment of c3–c5d1–d5e1–e8 previously latched in the first latch circuit 10 is transferred as a previous data segment into the second latch circuit 20. The current and previous data segments are simultaneously coupled into the first barrel shifter which transfers the 16-bit sequence of e1–e8f1–f7g1, beginning with the 8th bit in the previous data segment, on a lead 14 since the first window control signal is "24(modulo 16+8)". The first memory device 50 recognizes the first eight bits in the previous data segment as decoded word "E" and outputs this fixed length decoded word, E, through the output selection block 80 onto the lead 21. The first memory device 50 also outputs the length, "8", of this word on the lead 16. The second window control signal indicating the previous decoded length, "8", is then coupled to the second barrel shifter 40 which transfers the 16-bit sequence of f1–f7g100000000 into the second memory device 60. The first memory device 60 recognizes the first seven bits in the previous data segment as decoded word "F" and outputs this fixed length decoded word, F, to the output selection block 80 which, in response to the output change signal, outputs the fixed length decoded word, B, onto the lead 21. The second memory device 50 also outputs the length, "7", of this decoded word on the lead 17.

As may be seen from the above, it should be readily appreciated that, since the second barrel shifter is cascaded to the first barrel shifter and provides a second table memory device with a decoding window output sequence which is, independent of the accumulator, directly shifted in response to a codeword length output from a first table memory device, the VLC decoding apparatus of the present invention provides a further reduction of an operational delay in an accumulator, thereby advantageously achieving a high speed decoding operation.

While the present invention has been shown and described in connection with the preferred embodiments only, it will be readily apparent to those of ordinary skill in the art that many changes and modifications may be made without departing from the spirit and scope of the invention as defined in the appended claim.

What is claimed is:

1. A variable length code decoding apparatus for decoding, at a fixed clock rate, sequential variable length codewords supplied from an input buffer which stores an input bit stream to be decoded in fixed length segments having a length equal to the longest length of the sequential variable length codewords, said apparatus comprising:

first and second cascaded bit storage means, each having a bit capacity for storing one fixed length segment in response to a read signal, for providing two consecutive fixed length segments in parallel wherein the input of the first bit storage means is directly coupled to the input buffer;

first decoder shift means coupled to both of the outputs from the first and the second bit storage means and having a first decoding window for producing a first decoding window output sequence of the two fixed length segments, the bit length of the first decoding window output sequence being equal to the length of said one of the fixed length segments and said first decoding window being shifted in direct response to a window control signal;

first memory means coupled to the first decoder shift means for producing a fixed length codeword in response to a variable length codeword that begins at the first bit position of the first decoding window output sequence and for producing a first codeword length output corresponding to the decoded variable length codeword;

second decoder shift means connected to said first decoder shifter means and having a second decoding window for producing a second decoding window output sequence from bits contained in the first decoding window output sequence and a predetermined fixed length segment, the bit length of the second decoding window output sequence being equal to the length of said one of the fixed length segments and said decoding window being shifted in direct response to the first codeword length output so that the first bit position in the second decoding window output sequence is the first bit position of a next variable length codeword to be decoded in the first decoding window output sequence;

second memory means for producing a fixed length codeword in response to said next variable length codeword and for producing a second codeword length output corresponding to the decoded next variable length codeword; and accumulator means for adding the first and the second codeword length outputs to produce an added codeword length output and for adding, at each clock generated at the fixed clock rate, the added codeword length output to a previously accumulated codeword length output in order to produce the window control signal indicating the added and accumulated codeword length, said accumulator generating the read signal to retrieve a next fixed length segment stored in the input buffer when said added and accumulated codeword length is greater than the longest length of the variable length codewords, said next fixed length segment being stored in the first bit storage means and the fixed length segment previously stored in the first bit storage means being transferred to the second bit storage means.

* * * * *